US009515156B2

(12) United States Patent
Besser et al.

(10) Patent No.: US 9,515,156 B2
(45) Date of Patent: Dec. 6, 2016

(54) AIR GAP SPACER INTEGRATION FOR IMPROVED FIN DEVICE PERFORMANCE

(71) Applicant: Lam Research Corporation, Fremont, CA (US)

(72) Inventors: Paul Raymond Besser, Sunnyvale, CA (US); Bart van Schravendijk, Sunnyvale, CA (US); Yoshie Kimura, Castro Valley, CA (US); Gerardo A. Delgadino, Milpitas, CA (US); Harald Orkorn-Schmidt, Klagengurt (AT); Dengliang Yang, Union City, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 0 days.

(21) Appl. No.: 14/884,264

(22) Filed: Oct. 15, 2015

(65) Prior Publication Data
US 2016/0111515 A1  Apr. 21, 2016

Related U.S. Application Data

(60) Provisional application No. 62/065,284, filed on Oct. 17, 2014.

(51) Int. Cl.
H01L 29/78 (2006.01)
H01L 29/49 (2006.01)
H01L 29/66 (2006.01)

(52) U.S. Cl.
CPC ....... *H01L 29/4991* (2013.01); *H01L 29/6653* (2013.01); *H01L 29/6656* (2013.01); *H01L 29/66545* (2013.01); *H01L 29/66795* (2013.01); *H01L 29/785* (2013.01)

(58) Field of Classification Search
CPC ............. H01L 29/4991; H01L 29/6653; H01L 29/785; H01L 29/66795; H01L 29/66545; H01L 29/6656
See application file for complete search history.

(56) References Cited

U.S. PATENT DOCUMENTS 8,703,556 B2 *  4/2014  Kelly ................ H01L 29/66795
                                                          257/296

* cited by examiner

*Primary Examiner* — David Vu

(57) ABSTRACT

A method for providing a FinFET device with an air gap spacer includes providing a substrate a plurality of fins and a dummy gate arranged transverse to the plurality of fins; depositing a sacrificial spacer around the dummy gate; depositing a first interlayer dielectric (ILD) layer around the sacrificial spacer; selectively etching the dummy polysilicon gate relative to the first ILD layer and the sacrificial spacer; depositing a replacement metal gate (RMG); etching a portion of the RMG to create a recess surrounded by the sacrificial spacer; and depositing a gate capping layer in the recess. The gate capping layer is at least partially surrounded by the sacrificial spacer and is made of silicon oxycarbide (SiOC).

19 Claims, 12 Drawing Sheets

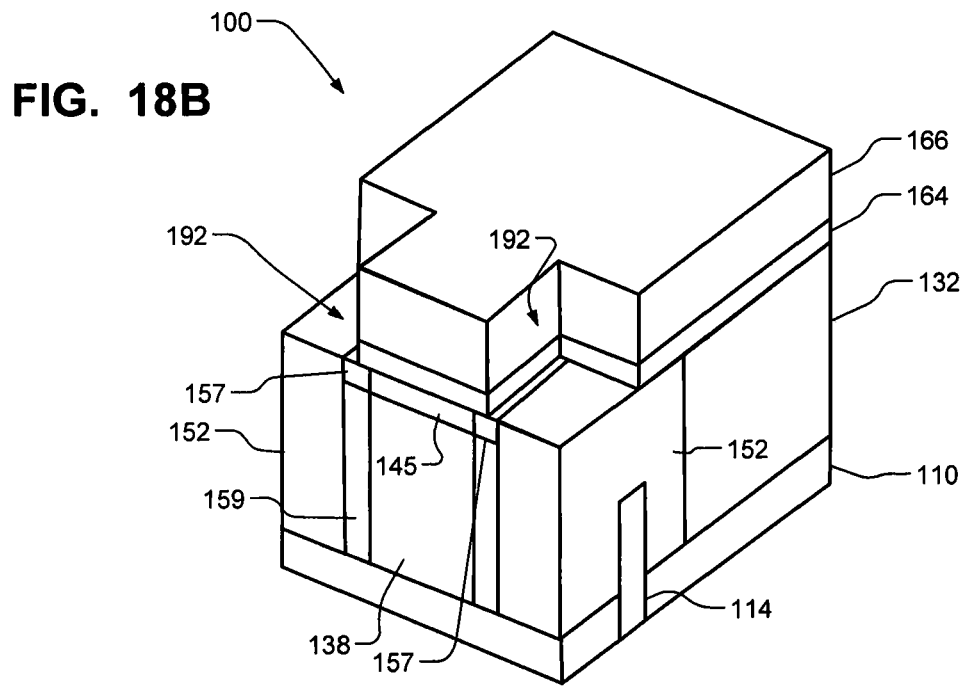
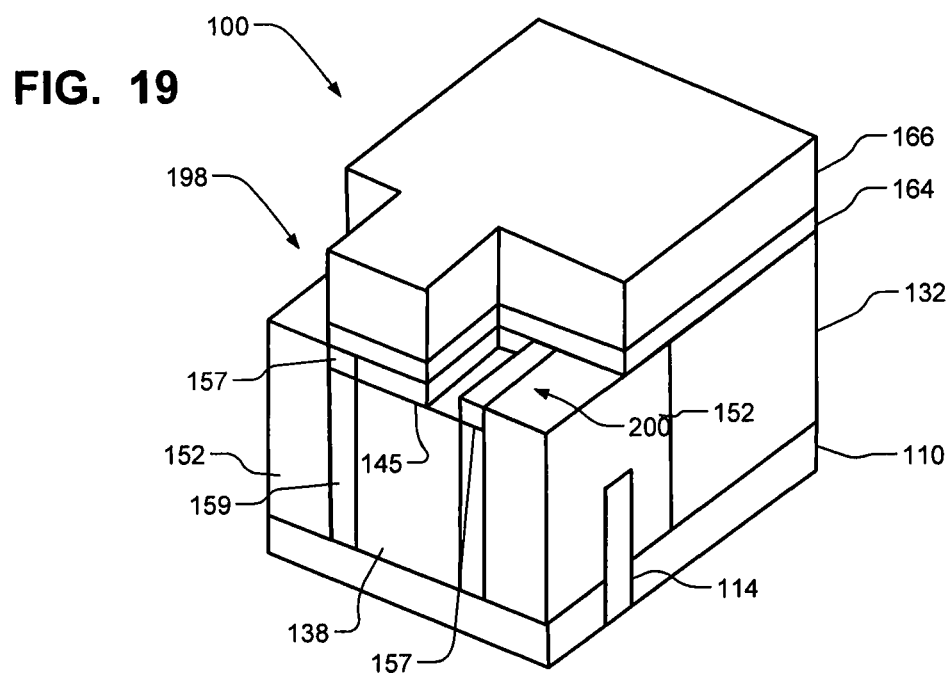

AIR GAP SPACER INTEGRATION FOR IMPROVED FIN DEVICE PERFORMANCE

CROSS-REFERENCE TO RELATED APPLICATIONS

This application claims the benefit of U.S. Provisional Application No. 62/065,284, filed Oct. 17, 2014. The entire disclosure of the application referenced above is incorporated herein by reference.

FIELD

The present disclosure relates to methods for processing substrates, and more particularly to methods for integrating air gap spacers in FinFET devices.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Referring now to FIG. 1A, a FinFET device 10 is shown to include a source region 14 and a drain region 18 arranged on one or more underlying layers 12. Source contact 20 extends in a vertical direction from the source region 14 to a source contact 22 arranged in a horizontal plane above the source region 14. Drain contact 28 extends in a vertical direction from the drain region 18 to a drain contact 30 arranged in a horizontal plane above the drain region 18. Gate regions 34 and 38 are arranged between the source region 14 and the drain region 18. A plurality of fins 40 extends transverse to the gate regions 38 between the source region 14 and the drain region 18.

Referring now to FIG. 1B, parasitic capacitance of the FinFET device 10 limits AC performance. Some of the parasitic capacitances are illustrated in FIG. 1B. A first parasitic capacitance C1 occurs between the source contact 22 and the drain contact 30. A second parasitic capacitance C2 occurs between the source/drain contacts 20, 22, 28 and 30 and gate region 38. A third parasitic capacitance C3 occurs between the gate regions 34 and 38 and the source/drain regions 14 and 18. A fourth parasitic capacitance C4 occurs between the source contact 20 and the drain region 18.

Spacer materials having a relatively low dielectric constant (k) have been proposed to reduce parasitic capacitance. For example, a silicon nitride (SiN) spacer with a dielectric constant k~7.5 has been used. Although other spacer materials have been proposed with lower dielectric constants (k~5 or less), the improvement is incremental.

SUMMARY

A method for providing a FinFET device with an air gap spacer includes providing a substrate including a plurality of fins and a dummy gate arranged transverse to the plurality of fins; depositing a sacrificial spacer around the dummy gate; depositing a first ILD layer around the sacrificial spacer; selectively etching the dummy gate relative to the first ILD layer and the sacrificial spacer; depositing a replacement metal gate (RMG); etching a portion of the RMG to create a recess surrounded by the sacrificial spacer; and depositing a gate capping layer in the recess. The gate capping layer is at least partially surrounded by the sacrificial spacer and is made of silicon oxycarbide (SiOC).

In other features, the gate capping layer is deposited using a remote plasma process. The sacrificial spacer is made of silicon nitride. The method includes performing chemical mechanical polishing (CMP) of the gate capping layer.

In other features, the method includes etching the first ILD layer around opposite ends of the plurality of fins to create recesses for self-aligned contacts (SACs) and depositing the SACs in the recesses. The depositing the SACs in the recesses includes depositing a barrier layer and depositing a metal layer.

In other features, the barrier layer includes titanium and titanium nitride layers. The barrier layer includes $WCN_x$, where x is an integer greater than zero. The SACs include a metal layer including a material selected from a group consisting of tungsten (W) and cobalt (Co).

In other features, the method includes removing the sacrificial spacer by selectively etching the sacrificial spacer relative to the first ILD layer, the gate capping layer, and the SACs to create an air gap spacer. The method includes depositing an air gap seal in an upper portion of the air gap spacer. The air gap seal is made of at least one of ILD, silicon dioxide, silicon dioxide with carbon doping and SiCO. The depositing the air gap seal includes depositing a seal layer on a top surface of the substrate; and performing chemical mechanical polishing (CMP) of the seal layer to define the air gap seal.

In other features, the seal layer is deposited using plasma-enhanced chemical vapor deposition. The method includes depositing an etch stop layer on the substrate. The etch stop layer includes SiCO. The method includes depositing a second ILD layer on the etch stop layer. The method includes etching portions of the second ILD layer and the etch stop layer to open up selected portions of underlying layers of the substrate.

A FinFET device includes a plurality of fins. A source contact is arranged in contact with first ends of the plurality of fins. A drain contact is arranged in contact with second ends of the plurality of fins. A metal gate is arranged on the underlying layer between and spaced from the source contact and the drain contact and in contact with the plurality of fins. The metal gate includes a gate capping layer made of silicon oxycarbide (SiOC).

In other features, an air gap is located between a first interlayer dielectric (ILD) layer and the metal gate, between the source contact and the gate and between the drain contact and the gate. An air gap seal is located in an upper portion of the air gap between the gate capping layer and the first ILD layer, between the gate capping layer and the drain contact and between the gate capping layer and the source contact. The air gap seal is made of a material selected from a group consisting of ILD, silicon dioxide, silicon dioxide doped with carbon, and silicon oxycarbide (SiOC).

In other features, an etch stop layer is arranged above the gate capping layer, the air gap seal and the first ILD layer. The etch stop layer is made of silicon oxycarbide (SiOC).

In other features, a second ILD layer is arranged above the etch stop layer.

A FinFET device includes a plurality of fins. A source contact is arranged in contact with first ends of the plurality of fins. A drain contact is arranged in contact with second ends of the plurality of fins. A metal gate is arranged between and spaced from the source contact and the drain contact and in contact with the plurality of fins. An air gap is located between first interlayer dielectric (ILD) layer and the metal gate, between the source contact and the gate and between the drain contact and the gate.

In other features, a gate capping layer is formed on the metal gate. The gate capping layer is made of silicon oxycarbide (SiOC). An air gap seal is located in an upper portion of the air gap between the gate capping layer and the first ILD layer, between the gate capping layer and the drain contact and between the gate capping layer and the source contact. The air gap seal is made of a material selected from a group consisting of ILD, silicon dioxide, silicon dioxide doped with carbon, and silicon oxycarbide (SiOC).

In other features, an etch stop layer is arranged above the gate capping layer, the air gap seal and the first ILD layer. The etch stop layer is made of silicon oxycarbide (SiOC). A second ILD layer is arranged above the etch stop layer.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIGS. 17A, 17B, 18A, 18B, and 19 are perspective, cross-sectional views illustrating various examples of the substrates after processing steps are used to open up the substrate to various sub-layers of the substrate according to the present disclosure.

In the drawings, reference numbers may be reused to identify similar and/or identical elements.

DETAILED DESCRIPTION

The present disclose relates to FinFET devices with air gap spacers and methods for integrating air gap spacers into FinFET devices. Air gap spacers are formed using a sacrificial spacer during integration. The sacrificial spacer is subsequently removed after self-aligned source/drain contact formation. The air gap spacer reduces FinFET parasitic capacitance. Low parasitic capacitance can be achieved without loss of process window or relaxing of lithography overlay requirements.

Figure 1A:
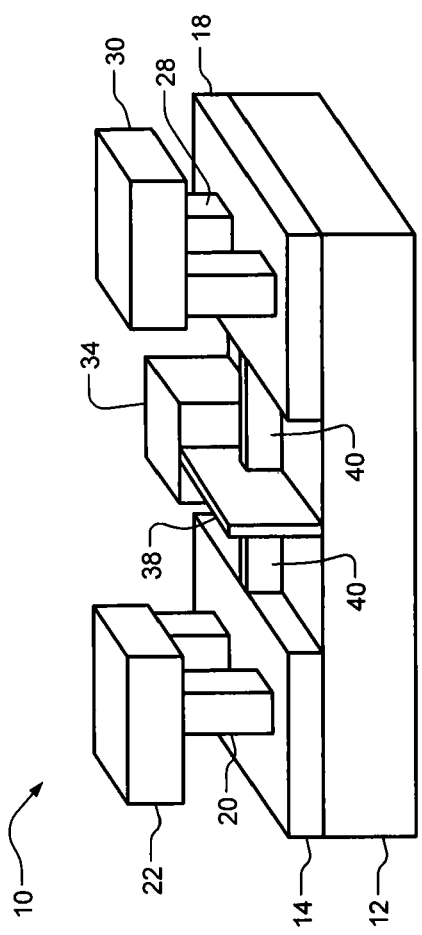
FIG. 1A is a perspective view illustrating a FinFET device according to the prior art.
Figure 1B:
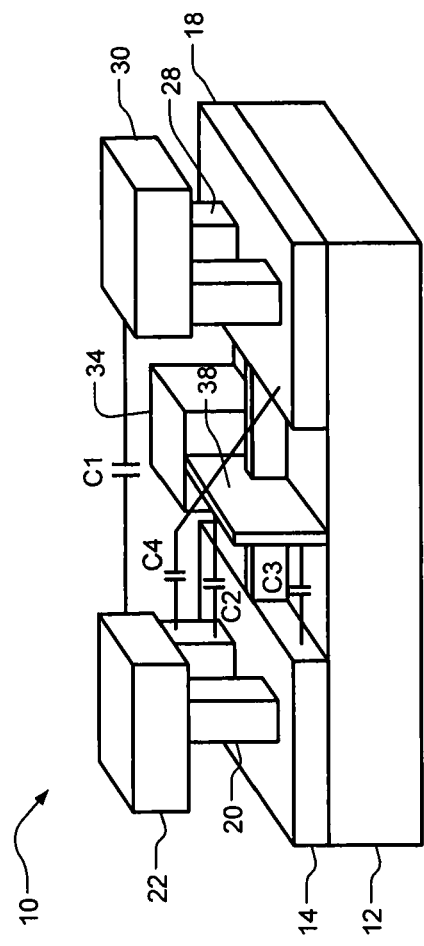
FIG. 1B is a perspective view illustrating parasitic capacitance of the FinFET device in FIG. 1A.
Figure 2:
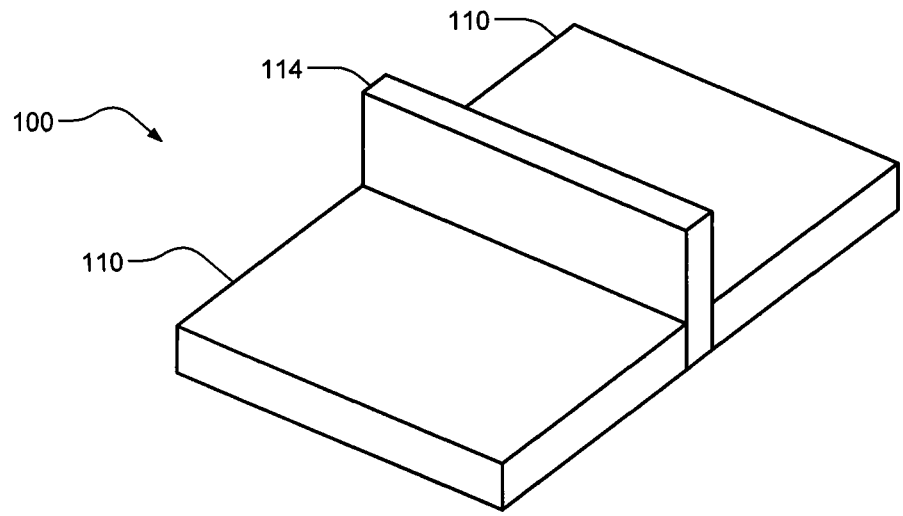
FIG. 2 is a perspective view illustrating an example of a substrate including a plurality of fins after shallow trench isolation (STI) recess etch according to the present disclosure.
Figure 3:
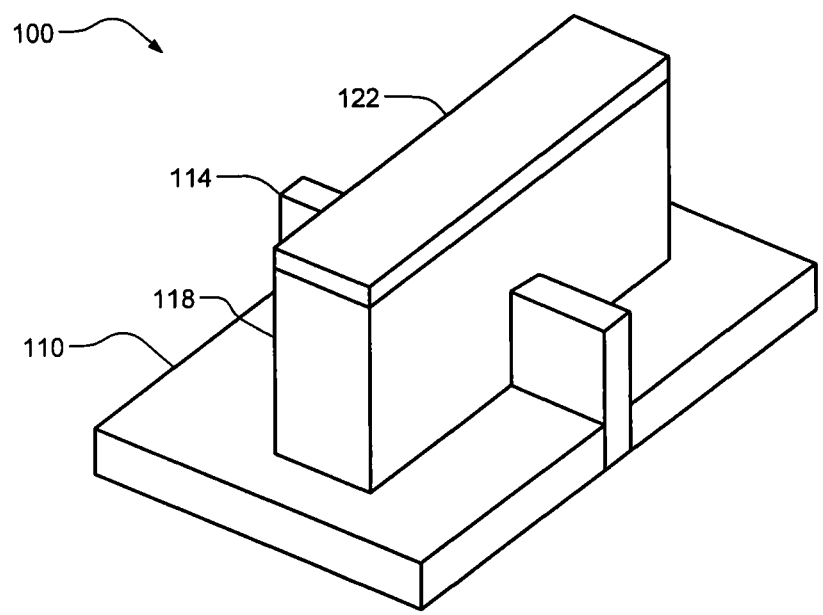
FIG. 3 is a perspective view illustrating an example of the substrate including a dummy gate according to the present disclosure.

Referring now to FIGS. 2-3, the substrate is shown after shallow trench isolation (STI) recess etch and dummy gate formation, respectively. In FIG. 2, the substrate 100 includes an ILD layer 110 and a plurality of fins 114. The ILD layer 110 may be made of low k dielectrics, doped oxides, flowable oxides, silicon dioxide ($SiO_2$) or other suitable material. In some examples, the plurality of fins 114 may be made of silicon (Si) with intervening STI oxide. STI oxide may also be located on a top surface of the plurality of fins 114.

In FIG. 3, a dummy gate 118 is deposited over the plurality of fins 114 and etched. In some examples, the dummy gate 118 is arranged on the ILD layer 110 and extends transverse to the plurality of fins 114. In some examples, the dummy gate 118 is made of polysilicon. A hardmask layer 122 may be used to mask the dummy gate 118 during etching.

Figure 4:
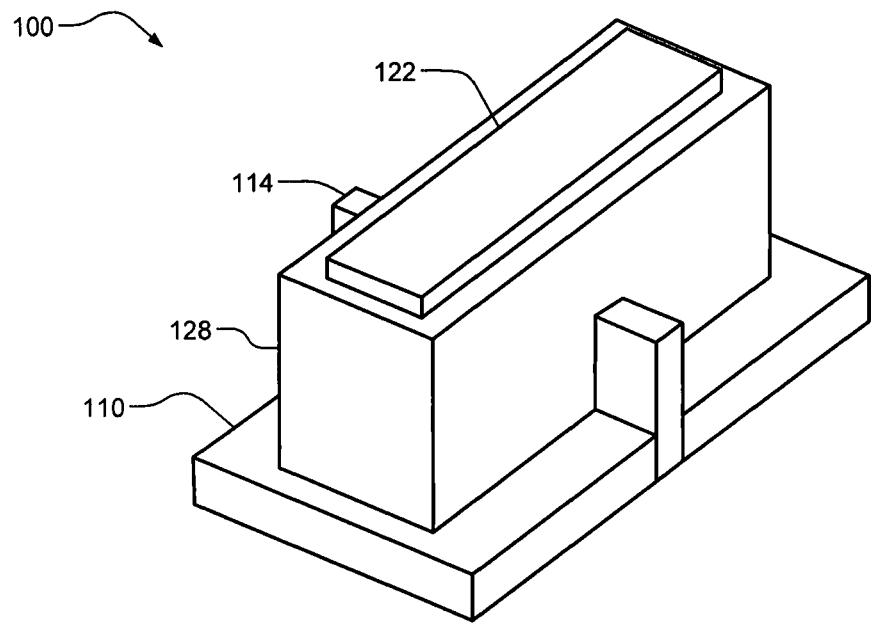
FIG. 4 is a perspective view illustrating an example of the substrate including a sacrificial spacer deposited around the dummy gate according to the present disclosure.
Figure 5:
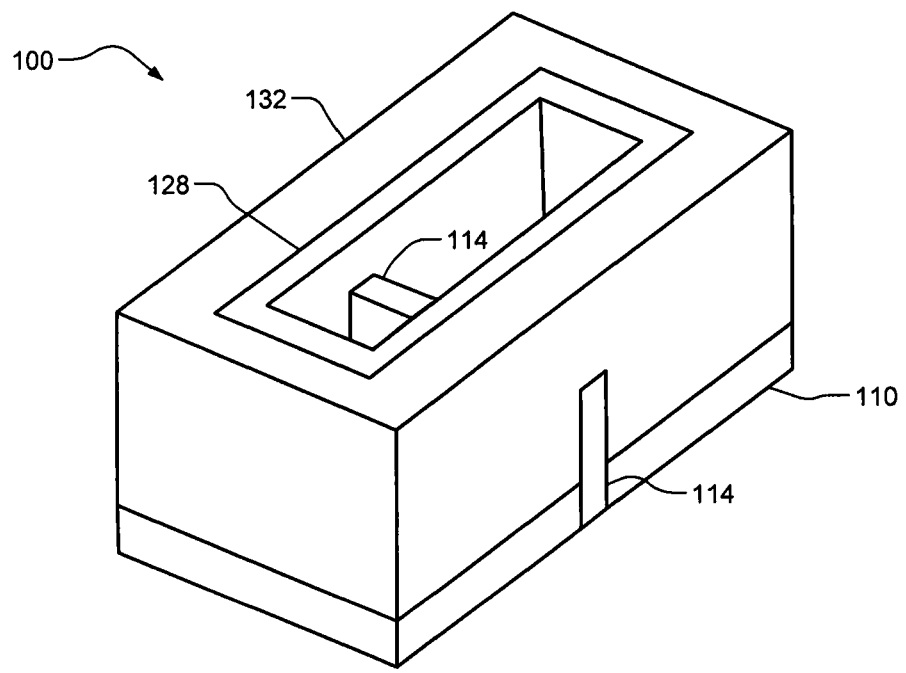
FIG. 5 is a perspective view illustrating an example of the substrate after the dummy gate is removed and interlayer dielectric (ILD) is deposited around the sacrificial spacer according to the present disclosure.

Referring now to FIGS. 4-5, a sacrificial spacer is deposited and etched and the dummy gate is removed, respectively. In FIG. 4, a sacrificial spacer 128 is deposited around an outer surface of the dummy gate 118 and etched. In some examples, the sacrificial spacer 128 is made of silicon nitride (SiN). In FIG. 5, ILD layer 132 is deposited around the sacrificial spacer 128. In addition, the dummy gate 118 and the hardmask layer 122 are removed by etching or ashing. In some examples, the silicon forming the dummy gate 118 is selectively etched relative to the silicon nitride (SiN) and the silicon dioxide ($SiO_2$) material of the substrate 100.

Figure 6:
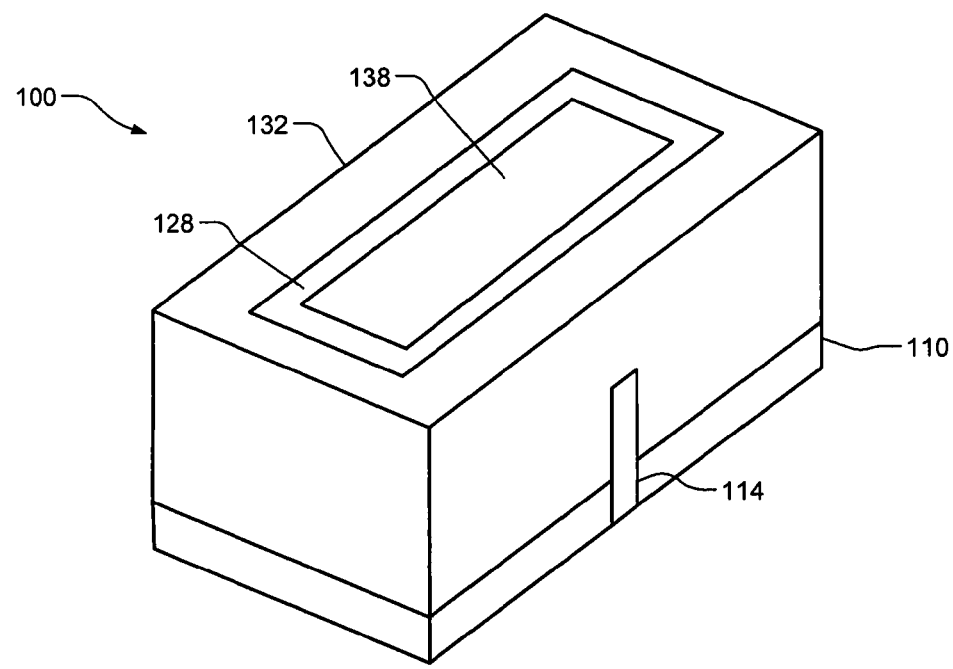
FIG. 6 is a perspective view illustrating an example of the substrate including a replacement metal gate (RMG) according to the present disclosure.

In FIG. 6, replacement metal gate (RMG) formation is shown. A replacement metal gate (RMG) 138 is deposited in a former location of the dummy gate 118. In some examples, the RMG 138 has a high dielectric (HK) constant in a predetermined thickness between 1 and 10 nm. In some examples, the RMG 138 is made of high dielectric constant materials such as hafnium oxide (HfO$_2$), HfSiO$_2$, aluminum oxide (Al$_2$O$_3$), zirconium oxide (ZrO$_2$) or titanium oxide (TiO$_2$); a metal work function-setting material such as titanium nitride (TiN), titanium aluminum nitride (TiAlN), tungsten nitride (WN$_x$) (where x is an integer), tungsten carbon nitride (WCN$_x$), cobalt (Co), or other metals; and a bulk conductive metal such as tungsten (W), Cobalt (Co) or aluminum (Al) and alloys thereof. In some examples, chemical mechanical polishing (CMP) may be performed after deposition of the RMG 138. In some examples, the top surface of the RMG 138 is coplanar with a top surface of the sacrificial spacer 128 and the ILD layer 132 after CMP.

Figure 7:
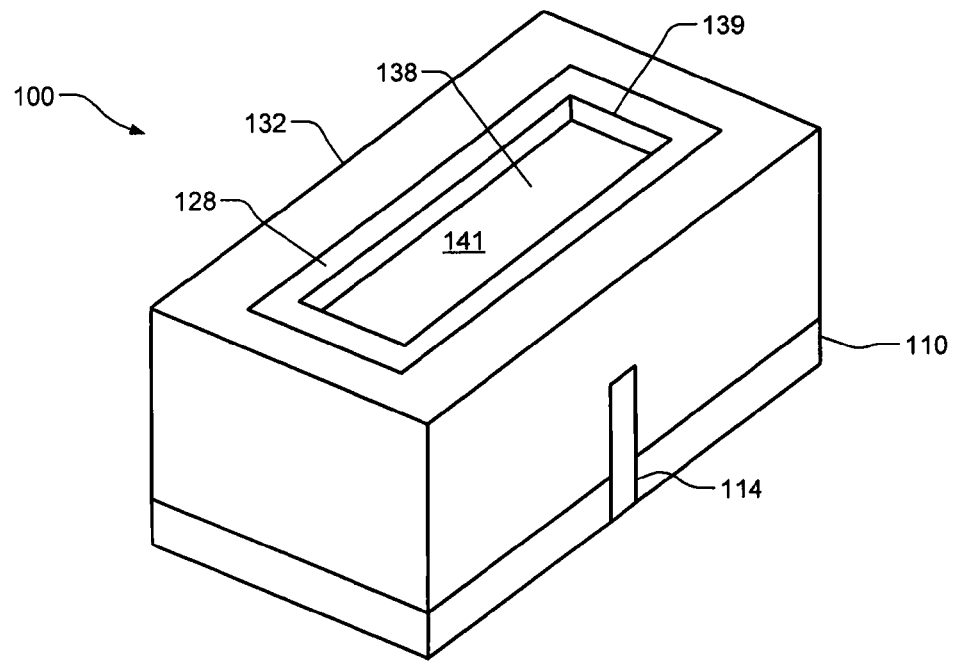
FIG. 7 is a perspective view illustrating an example of the substrate after a recess is etched in the RMG according to the present disclosure.

Referring now to FIG. 7, the RMG 138 is selectively and partially etched relative to the silicon nitride (SiN) and the silicon dioxide (SiO$_2$). More particularly, the RMG 138 is partially and selectively etched in a downward direction relative to the top surfaces of the sacrificial spacer 128 and the ILD layer 132 to create a recess 139 in the RMG 138. A top surface 141 of the RMG 138 is located below a plane including the top surfaces of the sacrificial spacer 128 and the ILD layer 132.

Figure 8:
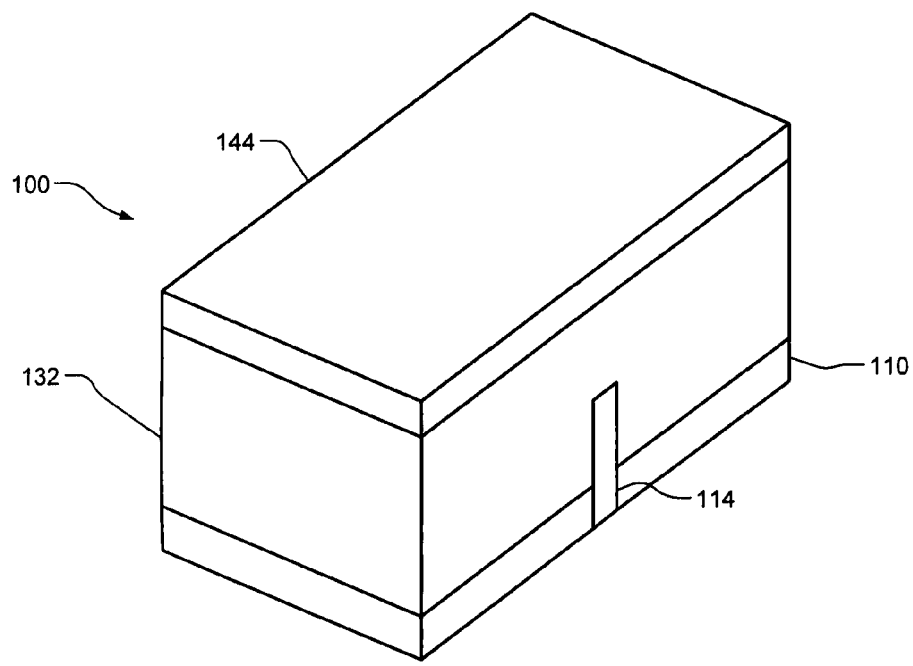
FIG. 8 is a perspective view illustrating an example of the substrate after a gate capping layer is deposited in the recess according to the present disclosure.
Figure 9:
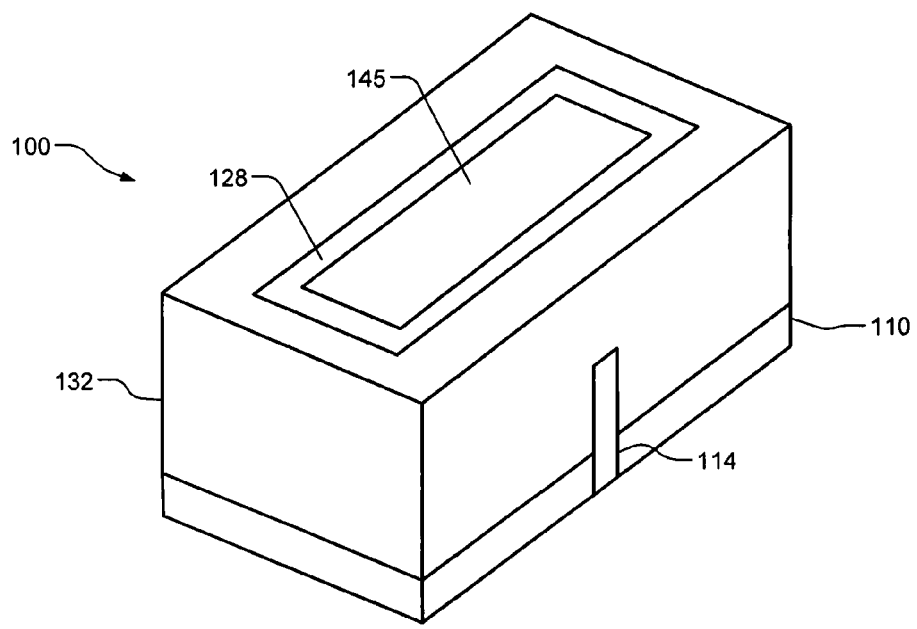
FIG. 9 is a perspective view illustrating an example of the substrate after chemical mechanical polishing (CMP) of the gate capping layer according to the present disclosure.

Referring now to FIGS. 8-9, gate capping layer deposition and gate capping layer chemical mechanical polishing (CMP) are shown, respectively. In FIG. 8, a gate capping layer 144 is deposited in the recess in the RMG 138 and on the top surface of the substrate 100. In some examples, the gate capping layer 144 may be made of silicon oxycarbide (SiOC) or another suitable material. In some examples, the gate capping layer 144 is deposited using a process as described in commonly-assigned U.S. patent application Ser. No. 13/494,836, entitled "Remote Plasma Based Deposition of SiOC Class Films", which was filed on Jun. 12, 2012, which is hereby incorporated by reference in its entirety. In some examples, the gate capping layer 144 is deposited using a remote plasma process described therein.

In FIG. 9, CMP of the gate capping layer 144 is performed to create a gate capping layer 145 to the RMG 138. In some examples, the top surface of the gate capping layer 145 is coplanar with a top surface of the sacrificial spacer 128 and the ILD layer 132 after the CMP.

Figure 10:
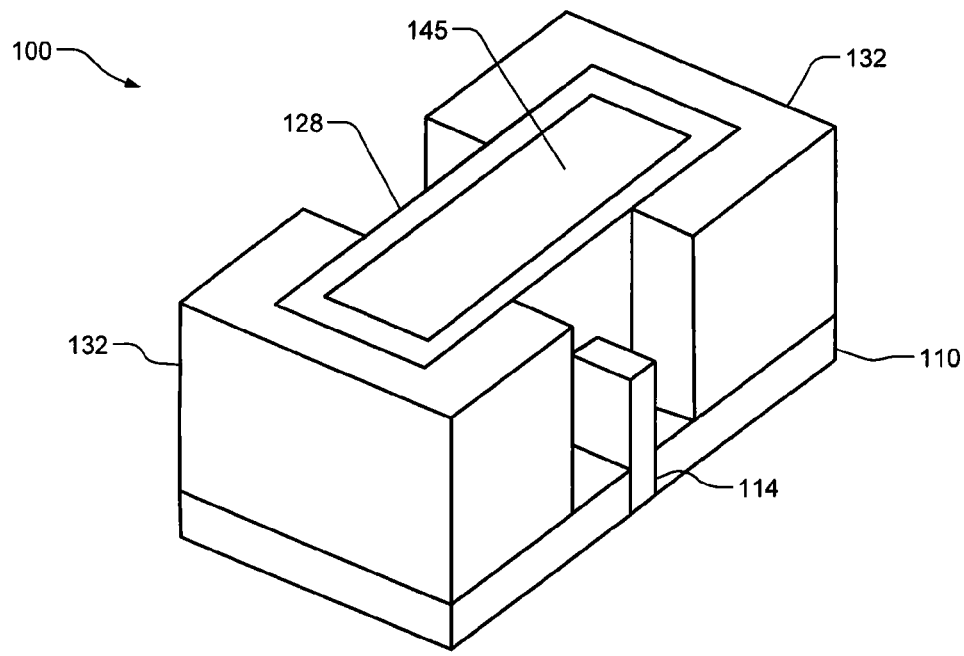
FIG. 10 is a perspective view illustrating an example of the substrate after etching oxide to incorporate a Self-Aligned Contact (SAC) scheme adjacent to opposite ends of the fins according to the present disclosure.
Figure 11:
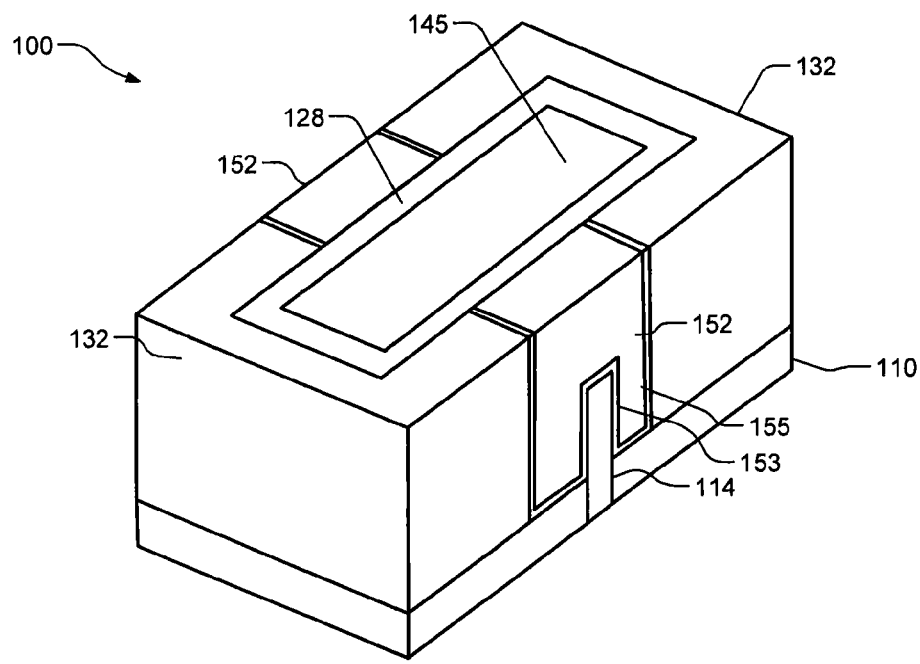
FIG. 11 is a perspective view illustrating an example of the substrate after filling the SACs with metal according to the present disclosure.
Figure 12:
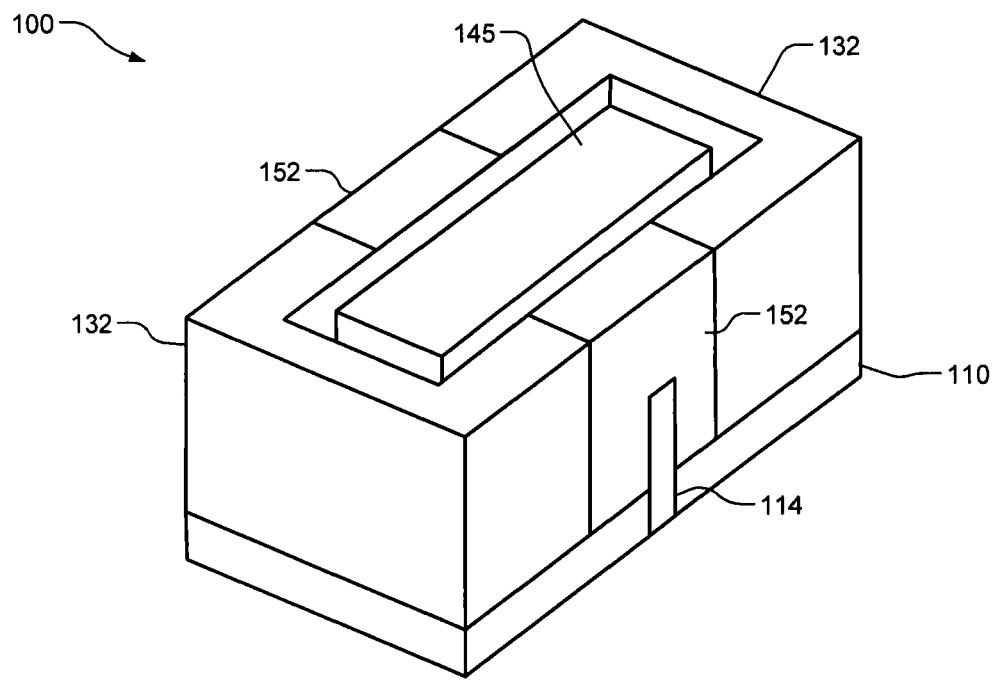
FIG. 12 is a perspective view illustrating an example of the substrate after removing the sacrificial spacer according to the present disclosure.

Referring now to FIGS. 10-12, self-aligned contact (SAC) area etch, SAC fill and sacrificial spacer removal are shown, respectively. In FIG. 10, areas of the ILD layer 132 surrounding opposite sides of the plurality of fins 114 are masked and etched using an etch which etches ILD selective to the gate capping layer and sacrificial spacer to expose the plurality of fins 114 and to create a self-aligned contact area. In FIG. 11, the self-aligned contact area is filled with SAC material 152. In some examples, the SAC material 152 includes metal layers 155 or barrier layers 153 and metal layers 155 deposited on the barrier layers 153. In some examples, the barrier layers 153 include a titanium (Ti) and titanium nitride (TiN) bilayer and the metal layers 155 include tungsten (W), although other materials can be used, such as WCN$_x$ for the barrier and Co for the metal layer. In FIG. 12, the sacrificial spacer 128 is removed.

For example, etching of the sacrificial spacer 128 may be a selective etching of silicon nitride relative to the other exposed materials. The etching may be wet or dry etching. In some examples, the silicon nitride is etched using a process described in commonly-assigned U.S. patent application Ser. No. 14/676,710, filed on Apr. 1, 2015 and entitled "Method for Achieving Ultra-High Selectivity While Etching Silicon Nitride", which is hereby incorporated by reference in its entirety. In some examples, the silicon nitride is etched using a process described in in commonly-assigned U.S. Patent Provisional Application Ser. No. 62/241,827, filed on Oct. 15, 2015 and entitled "Systems and Methods for Ultrahigh Selective Nitride Etch", which is hereby incorporated by reference in its entirety.

Figure 13:
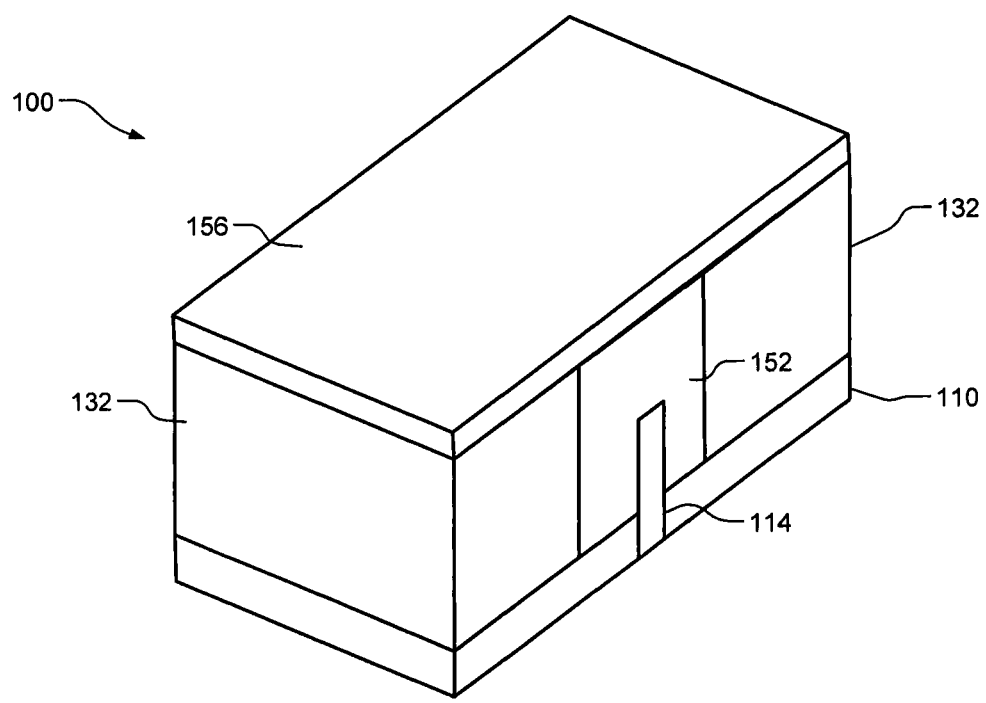
FIG. 13 is a perspective view illustrating an example of the substrate after deposition of a seal layer over an air gap according to the present disclosure.
Figure 14:
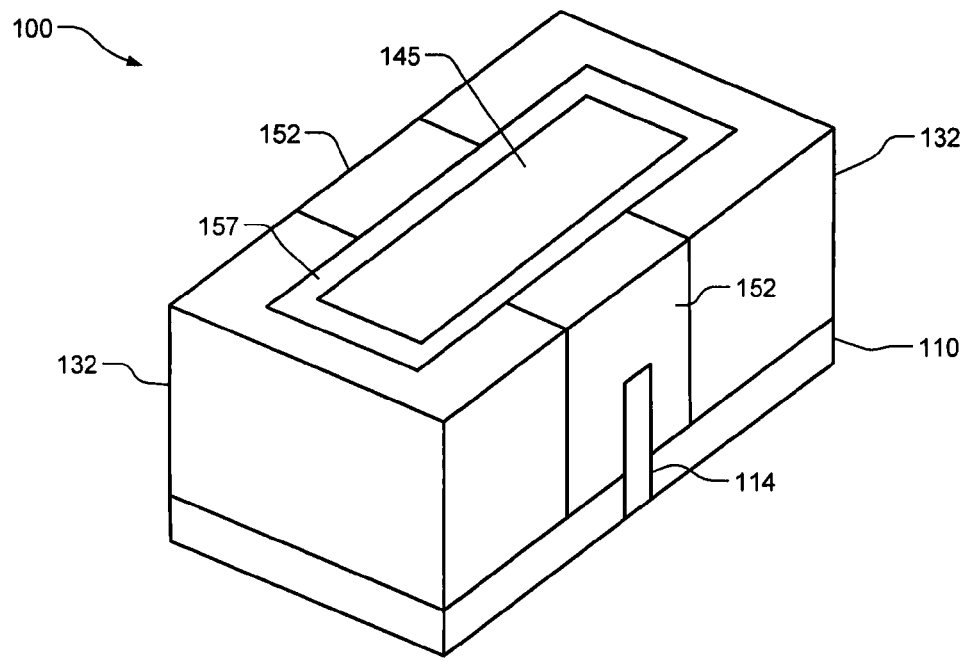
FIG. 14 is a perspective view illustrating an example of the substrate after CMP is performed on the seal layer to create an air gap seal according to the present disclosure.
Figure 15:
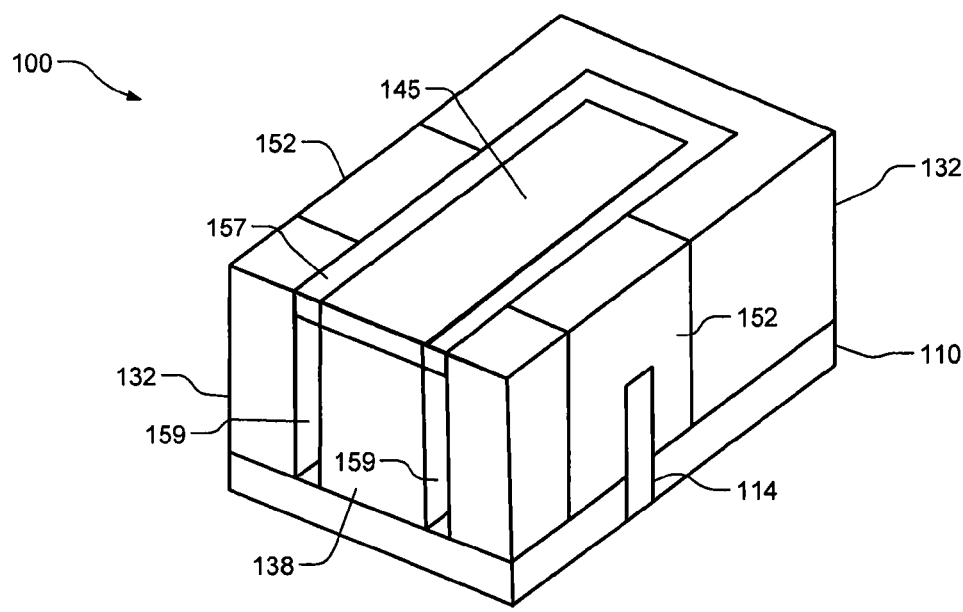
FIG. 15 is a perspective, cross-sectional view illustrating an example of the substrate, the air gap seal and a gap below the air gap seal according to the present disclosure.

Referring now to FIGS. 13-15, a seal layer is deposited on the substrate and CMP is performed to create an air gap spacer. In FIG. 13, a seal layer 156 is deposited on a top surface of the substrate 100. During deposition, an upper portion of an air gap 159 created after the sacrificial spacer 128 is removed is at least partially filled by the seal layer 156. In some examples, the seal layer 156 is made of ILD, silicon dioxide (SiO$_2$), SiO$_2$ with carbon doping, or silicon oxycarbide (SiOC). In some examples, the seal layer 156 is deposited using plasma enhanced chemical vapor deposition (PECVD), although other deposition processes may be used.

In some examples, the seal layer 156 includes SiOC that is deposited using plasma enhanced chemical vapor deposition as described in commonly-assigned U.S. patent application Ser. No. 13/494,836, entitled "Remote Plasma Based Deposition of SiOC Class Films", which was filed on Jun. 12, 2012, which is hereby incorporated by reference in its entirety. In some examples, a bread loaf effect occurs in a top portion of the air gap to pinch off the air gap.

In FIG. 14, CMP is used to remove a portion of the seal layer 156 located on the top surface of the substrate 100 to create an air gap seal 157. In some examples, the top surface of the air gap seal 157 is coplanar with a top surface of the gate capping layer 145 and the ILD layer 132 after CMP. In FIG. 15, a cross-section of the substrate taken along a plane parallel to and spaced from the plurality of fins 114 is shown. The air gap 159 is located below the air gap seal 157.

Figure 16:
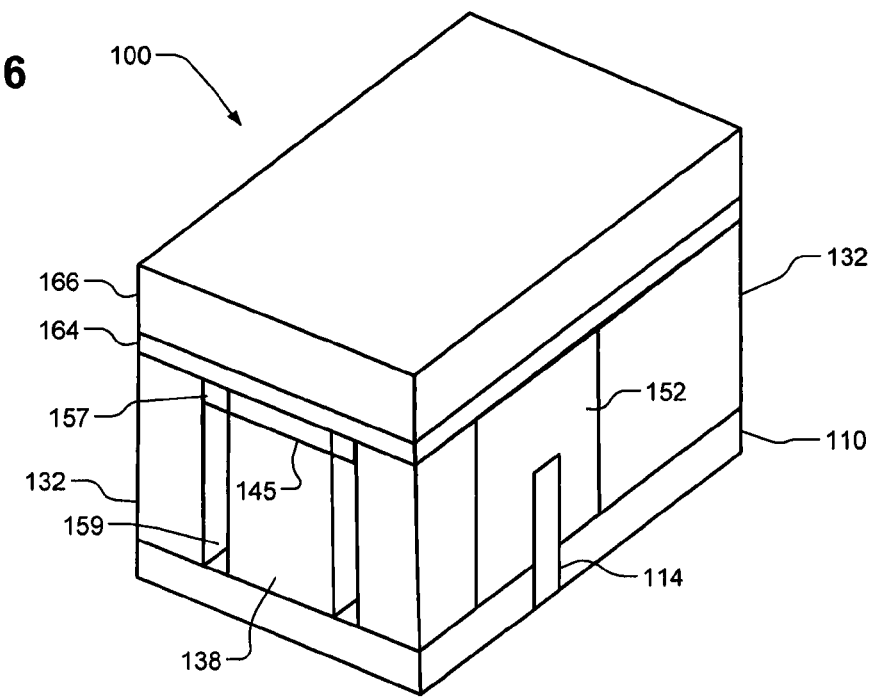
FIG. 16 is a perspective, cross-sectional view illustrating an example of an etch stop layer and an ILD layer after deposition according to the present disclosure.

Referring now to FIG. 16, an etch stop layer 164 is deposited on the top surface of the substrate 100. In some examples, the etch stop layer 164 includes SiOC, although other materials may be used. In some examples, the SiOC is deposited as described in commonly-assigned U.S. patent application Ser. No. 13/494,836, entitled "Remote Plasma Based Deposition of SiOC Class Films", which was filed on Jun. 12, 2012, which is hereby incorporated by reference in its entirety. ILD layer 166 is deposited on the etch stop layer 164.

Figure 17A:
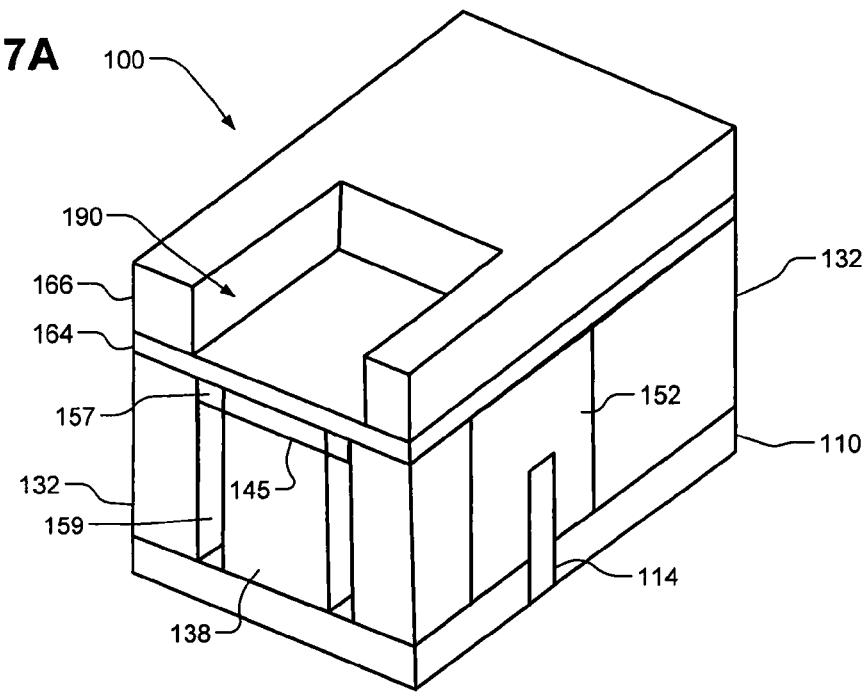
Figure 17B:
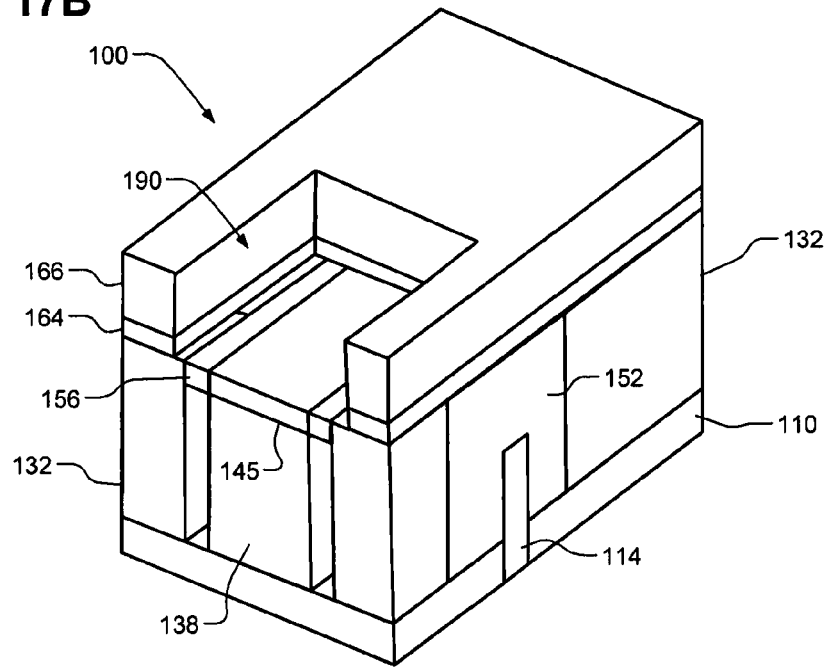

Referring now to FIGS. 17A-19, various different etching steps are performed to open up different portions of the substrate. In FIGS. 17A-17B, an example of various etch steps are shown. In FIG. 17A, the ILD layer 166 is etched to selectively expose underlying layers in a portion 190 of the etch stop layer 164. In FIG. 17B, the etch stop layer 164 is etched to open up portions of the gate capping layer 145, the air gap seal 157, the metal layers 155 and the ILD layer 132 for further processing.

Figure 18A:
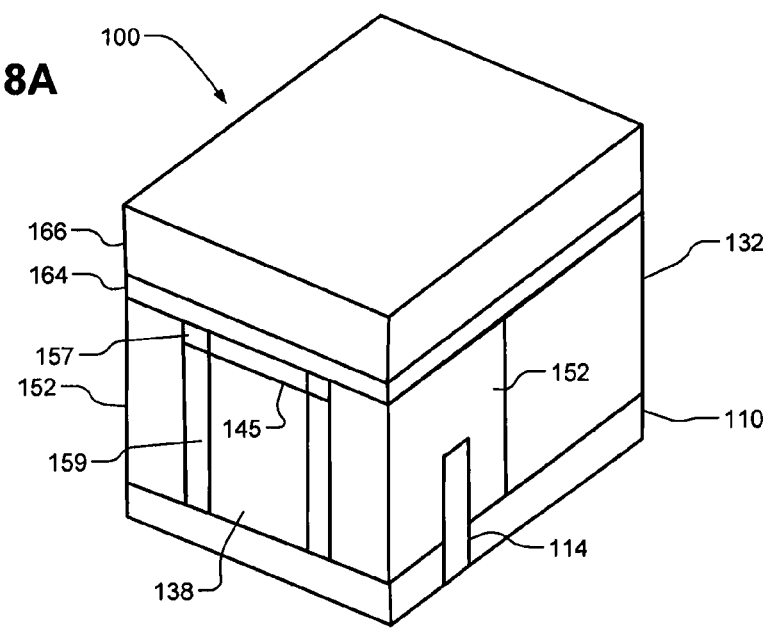

In FIGS. 18A and 18B, the ILD layer 166 and the etch stop layer 164 are etched to selectively expose underlying layers in portions 192 of the substrate 100. In FIG. 18B, different portions of the air gap seal 157, the metal layers 155 and the ILD layer 132 are opened up for further processing.

In FIG. 19, the ILD layer 166 is patterned and etched to expose underlying layers in portions 198 and 200 of the substrate 100. Portions of the air gap seal 157, the metal layers 155, the RMG 138 and the ILD layer 132 are opened up for further processing. As can be appreciated, various other sublayers may be opened up for further processing.

Figure 20:
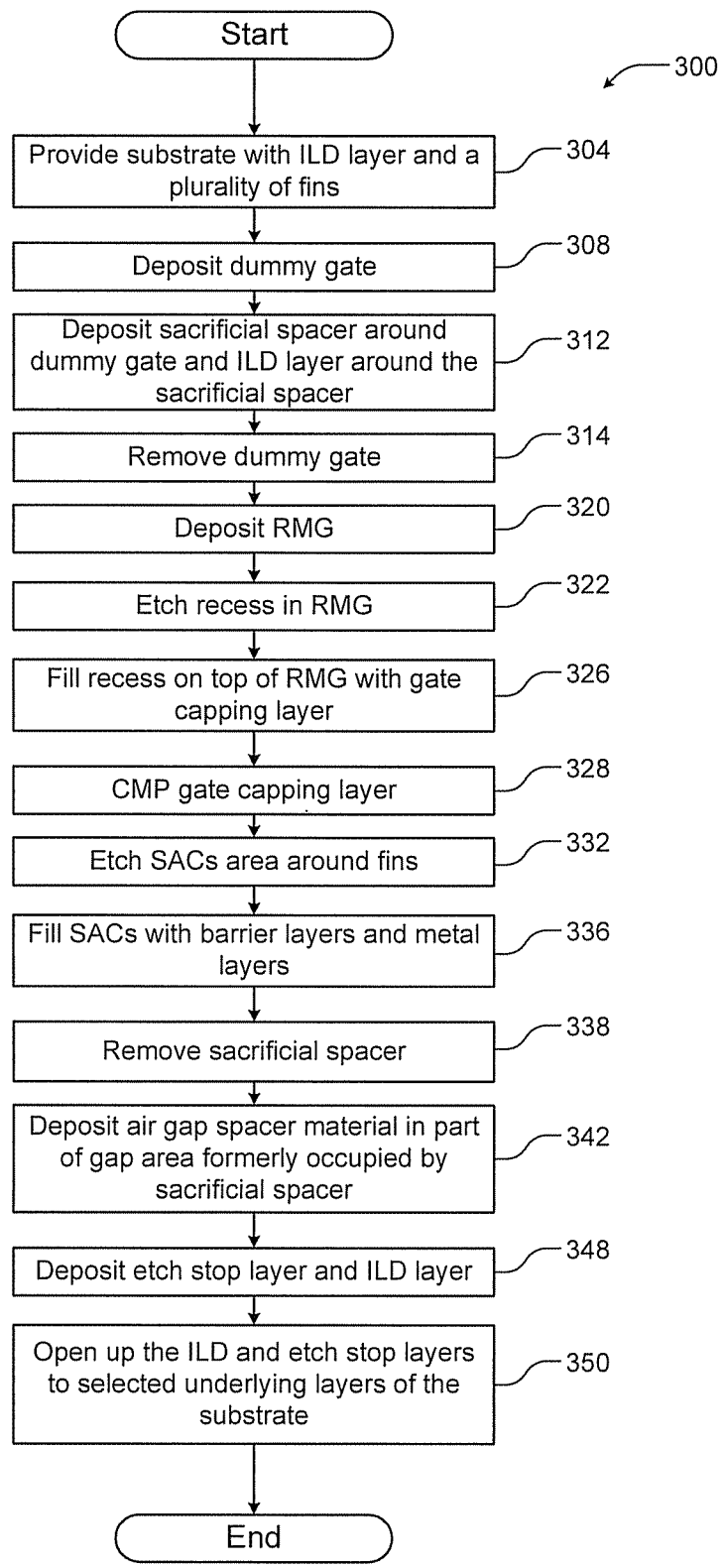
FIG. 20 is a method for creating an air gap spacer for a FinFET device according to the present disclosure.

Referring now to FIG. 20, a method 300 for creating an air gap spacer for a FinFET device is shown. At 304, the substrate is provided with an ILD layer and a plurality of fins. At 308, a dummy gate is deposited. At 312, a sacrificial spacer is deposited around the dummy gate and an ILD layer is deposited around the sacrificial spacer. At 314, the dummy gate is removed. At 320, a replacement metal gate (RMG) is deposited. At 322, a recess is etched into a portion of the (RMG). At 326, a recess on top of the RMG is filled with a gate capping layer. At 328, CMP is performed on the gate capping layer. At 332, self-aligned contacts (SAC) area are etched around the plurality of fins. At 336, the SACs are filled with barrier layers and metal layers. At 338, the sacrificial spacer is removed to create an air gap. At 342, air gap spacer material is deposited in part of the gap area formerly occupied by the sacrificial spacer. At 348, an etch stop layer and an ILD layer are deposited on the substrate. At 350, the ILD and etch stop layers are selectively opened in portions thereof to allow further connections to and processing of underlying layers of the substrate.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

What is claimed is:

1. A method for providing a FinFET device with an air gap spacer, comprising:
    providing a substrate including a plurality of fins and a dummy gate arranged transverse to the plurality of fins;
    depositing a sacrificial spacer around the dummy gate;
    depositing a first interlayer dielectric (ILD) layer around the sacrificial spacer;
    selectively etching the dummy gate relative to the first ILD layer and the sacrificial spacer;
    depositing a replacement metal gate (RMG);
    etching a portion of the RMG to create a recess surrounded by the sacrificial spacer; and
    depositing a gate capping layer in the recess, wherein the gate capping layer is at least partially surrounded by the sacrificial spacer and is made of silicon oxycarbide (SiOC).

2. The method of claim 1, wherein the gate capping layer is deposited using a remote plasma process.

3. The method of claim 1, wherein the sacrificial spacer is made of silicon nitride.

4. The method of claim 1, further comprising performing chemical mechanical polishing (CMP) of the gate capping layer.

5. The method of claim 1, further comprising:
    etching the first ILD layer around opposite ends of the plurality of fins to create recesses for self-aligned contacts (SACs); and
    depositing the SACs in the recesses.

6. The method of claim 5, wherein the depositing the SACs in the recesses includes:
    depositing a barrier layer; and
    depositing a metal layer.

7. The method of claim 6, wherein the barrier layer includes titanium and titanium nitride layers.

8. The method of claim 6, wherein the barrier layer includes WCNx, where x is an integer greater than zero.

9. The method of claim 5, wherein the SACs include a metal layer including a material selected from a group consisting of tungsten (W) and cobalt (Co).

10. The method of claim 5, further comprising removing the sacrificial spacer by selectively etching the sacrificial spacer relative to the first ILD layer, the gate capping layer, and the SACs to create an air gap spacer.

11. The method of claim 10, further comprising depositing an air gap seal in an upper portion of the air gap spacer.

12. The method of claim 11, wherein the air gap seal is made of at least one of ILD, silicon dioxide, silicon dioxide with carbon doping and SiOC.

13. The method of claim 11, wherein the depositing the air gap seal includes:
    depositing a seal layer on a top surface of the substrate; and
    performing chemical mechanical polishing (CMP) of the seal layer to define the air gap seal.

14. The method of claim 13, wherein the seal layer is deposited using plasma-enhanced chemical vapor deposition.

15. The method of claim 13, further comprising depositing an etch stop layer on the substrate.

16. The method of claim 15, wherein the etch stop layer includes SiOC.

17. The method of claim 15, further comprising depositing a second ILD layer on the etch stop layer.

18. The method of claim 17, further comprising etching portions of the second ILD layer and the etch stop layer to open up selected portions of underlying layers of the substrate.

19. The method of claim 11, wherein the dummy gate is made of polysilicon.

* * * * *